(12) United States Patent
Kobayashi

(10) Patent No.: US 7,332,770 B2
(45) Date of Patent: Feb. 19, 2008

(54) SEMICONDUCTOR DEVICE

(75) Inventor: Kenya Kobayashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 24 days.

(21) Appl. No.: 11/192,011

(22) Filed: Jul. 29, 2005

(65) Prior Publication Data
US 2006/0244054 A1 Nov. 2, 2006

(30) Foreign Application Priority Data
Apr. 28, 2005 (JP) ............................. 2005-132443

(51) Int. Cl.
*H01L 29/72* (2006.01)
(52) U.S. Cl. .................. 257/328; 257/329; 257/330; 257/331; 257/339; 257/345; 257/401; 257/402
(58) Field of Classification Search ................ 257/329, 257/328, 330, 331, 339, 345, 401, 407
See application file for complete search history.

(56) References Cited
U.S. PATENT DOCUMENTS
6,133,099 A 10/2000 Sawada

2006/0108634 A1* 5/2006 Miura .................. 257/328
2006/0170036 A1* 8/2006 Yilmaz .................. 257/329
2006/0170037 A1* 8/2006 Yamauchi et al. .......... 257/330

OTHER PUBLICATIONS

Hitoshi Ninomiya, et al., Ultra-low On-resistance 60-100 V Superjunction UMOSFETs Fabricated by Multiple Ion-Implantation, IEEE Proceeding of 2004 International Symposium on Power Semiconductor Devices & IC's, pp. 177-180.

* cited by examiner

*Primary Examiner*—Edward Wojciechowicz
(74) *Attorney, Agent, or Firm*—McGinn IP Law Group, PLLC

(57) ABSTRACT

A semiconductor device of this invention is a vertical power MOSFET having a plurality of first trenches where a trench gate is formed. It has a first column region of a second conductivity type placed beneath the first trenches and formed vertically in an epitaxial layer of a first conductivity type, and a second column region of the second conductivity type placed beneath a base region between the first trenches and formed vertically in the epitaxial layer of the first conductivity type. A sum of depletion charge in the first and the second column regions is substantially equal to depletion charge in the epitaxial layer of the first conductivity type.

18 Claims, 4 Drawing Sheets

SEMICONDUCTOR DEVICE

BACKGROUND OF THE INVENTION

1. Field of the Invention

The present invention relates to a semiconductor device and, particularly, to a vertical MOSFET.

2. Description of Related Art

A vertical power MOSFET is known as a MOSFET having a high breakdown voltage.

Important characteristics of the power MOSFET include on-resistance (Ron) and breakdown voltage (BVDSS). However, a tradeoff exists between the two characteristics in normal power MOSFETs. For example, reducing the on-resistance results in a lower breakdown voltage; on the other hand, increasing the breakdown voltage results in higher on-resistance.

In the field of high breakdown voltage MOSFETs, superjunction technology which reduces the on-resistance while keeping the breakdown voltage characteristics is proposed.

FIG. 6 is a cross-sectional view of a vertical power MOSFET having the superjunction structure (hereinafter as SJ structure) described in H. Ninomiya, Y. Miura, K. Kobayashi, "Ultra-low On-resistance 60-100V Superjunction UMOSFETs Fabricated by Multiple Ion Implantation", IEEE Proceeding of 2004 International Symposium on Power Semiconductor Devices & IC's. In the vertical power MOSFET of FIG. 6, a P base layer 203 and an N+ source layer 204 are formed on an N epitaxial layer 202, which is formed on the surface of an N+ silicon substrate 201. Further, a trench 205 is formed in the N epitaxial layer 202, penetrating through the P base layer 203 and the N+ source layer 204. A gate oxide film 206 and a trench gate 207 made of polysilicon are embedded in the gate trench 205.

An interlayer oxide film 208 is formed on the trench gate 207, and a source electrode 210 is formed on its surface. A part of the N+ source layer 204 is exposed from the interlayer oxide film 208, and the N+ source layer 204 and the source electrode 210 come into contact with each other at the exposed part.

A P column region 209 is formed vertically in the N epitaxial layer 202 between adjacent trench gates 207. A drain electrode 211 is formed on the rear surface of the N+ silicon substrate 201.

In the SJ structure, the breakdown voltage characteristics reach their maximum when depletion charge in the N epitaxial layer 202 and depletion charge in the P column region 209 are equal. Thus, when a high voltage is applied between the source and drain of the vertical power MOSFET, if the depletion charge in the N epitaxial layer 202 and the depletion charge in the P column region 209 are in equilibrium, a depletion layer appears uniformly in the N epitaxial layer 202, thereby improving the breakdown voltage characteristics. The depletion charge is determined by the impurity concentration doped into the N epitaxial layer 202 and the P column region 209.

An application of the vertical power MOSFET is recently found in a DC/DC converter of a small personal computer (PC), communication equipment and so on, in which high speed processing is required. It is important in a vertical power MOSFET used in such applications to reduce parasitic capacitance for high-speed switching. Thus, some techniques reduce a total area of the gate oxide film 206 by reducing the density of a cell constituting a transistor without significantly deteriorating the on-resistance characteristics. Reducing the cell density leads to the relatively larger cell size, resulting in a relatively larger distance between the trench gates 207.

In this case, the structure of the conventional vertical power MOSFET, which has the P column region 209 only between the trench gates 207, results in a longer distance between the adjacent P column regions 209. Thus, it is necessary in the conventional vertical power MOSFET to increase the impurity concentration of the P column region 209 in order to keep the equilibrium in the depletion charge between the N epitaxial layer 202 and the P column region 209. However, since there is a limitation in the impurity concentration of the P column region 209, it is difficult to solve the problem by increasing the impurity concentration.

Another approach to solve the above problem is to increase the width of the P column region 209. However, the wide P column region 209 could impede the drain current path, resulting in resistance causing the on-resistance to increase.

SUMMARY OF THE INVENTION

According to one aspect of the invention, there is provided a semiconductor device of a vertical MOSFET having a plurality of first trenches where a trench gate is formed, which includes first column regions of a second conductivity type placed beneath the first trenches respectively and formed vertically in an layer of a first conductivity type, and a second column region of the second conductivity type placed beneath a base region between the first trenches and formed vertically in the layer of the first conductivity type. In this semiconductor device, total depletion charge in the first and the second column regions is substantially equal to depletion charge in the layer of the first conductivity type.

According to another aspect of the invention, there is provided a method of manufacturing a semiconductor device, including forming a plurality of first trenches in each of which a trench gate is to be formed, in an epitaxial layer of a first conductivity type, implanting impurity of a second conductivity type into a part beneath each of the first trenches to form a first column region, and implanting impurity of the second conductivity type into a part beneath a base region formed between the first trenches to form a second column region. In this method, the first and the second column regions are formed with impurity concentration such that total depletion charge in the first and the second column regions is substantially equal to depletion charge in the epitaxial layer.

It is thereby possible to obtain high source-drain breakdown voltage even when a distance between the trench gates is large. It is also possible to achieve low on-resistance because the first and the second column regions do not interrupt a drain current path.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

First Embodiment

Figure 1:
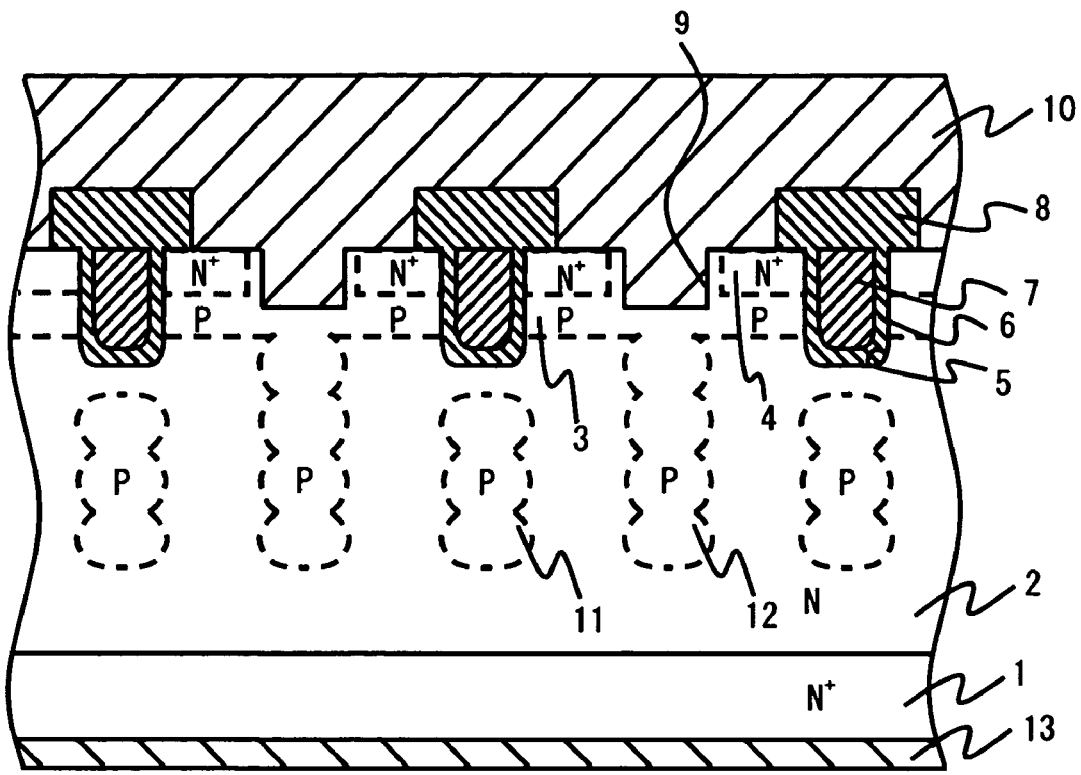
FIG. 1 is a cross-sectional view of a vertical power MOSFET of a first embodiment.

FIG. 1 shows a cross-sectional view of a vertical power MOSFET according to a first embodiment of the invention. In the vertical power MOSFET, an N epitaxial layer 2 having a lower impurity concentration than $N^+$ type is formed on a silicon substrate 1 of a first conductivity type (for example, $N^+$). A base layer 3 of a second conductivity type (for example, P) is formed on the N epitaxial layer 2. An $N^+$ source layer 4 is selectively formed on the surface of the P base layer 3. Further, first trenches (for example, gate trench) 5 are formed in the N epitaxial layer 2, penetrating through the P base layer 3 and the $N^+$ source layer 4. A gate oxide film 6 and a trench gate 7 made of polysilicon are buried in the first trench 5.

An interlayer oxide film 8 is formed above the trench gate 7. Second trenches (for example, column trenches) 9 are formed between the adjacent gate trenches 5 where the P base layer 3 is exposed. A source electrode 10 is formed thereon.

A first column region (for example, P column region) 11 is formed vertically in the N epitaxial layer 2 beneath the gate trench 5. Further, a second column region (for example, P column region) 12 is formed vertically beneath the column trench 9 in the N epitaxial layer 2. A drain electrode 13 is formed on the back surface of the $N^+$ silicon substrate 1.

The impurity concentration is set so that total depletion charge in the P column regions 11 and 12 and depletion charge in the N epitaxial layer 2 are substantially equal in the vertical power MOSFET.

The process of manufacturing the MOSFET of this embodiment is described hereinafter. First, the process grows the N epitaxial layer 2 on the surface of the $N^+$ silicon substrate 1. Then, after forming an oxide film ($SiO_2$) with a thickness of 10 to 50 nm by thermal oxidation, it deposits a nitride film ($Si_3N_4$) with a thickness of 100 to 200 nm and an oxide film with a thickness of 100 to 200 nm by chemical vapor deposition (CVD), and patterns the composite film by photolithography. After that, the process performs silicon etching using the composite film as a mask, thereby forming the gate trench 5 in the N epitaxial layer 2. Then, after removing the oxide film of the outermost surface by etching, the aperture corner and the bottom corner of the gate trench 5 are rounded using the method described in U.S. Pat. No. 6,133,099, the disclosure of which is herein incorporated by reference. The process then removes the nitride film and the oxide film formed in the rounding by etching, and forms the gate oxide film 6 with a thickness of 10 to 100 nm on the surface of the N epitaxial layer 2 and in the gate trench 5 by thermal oxidation.

Figure 2:
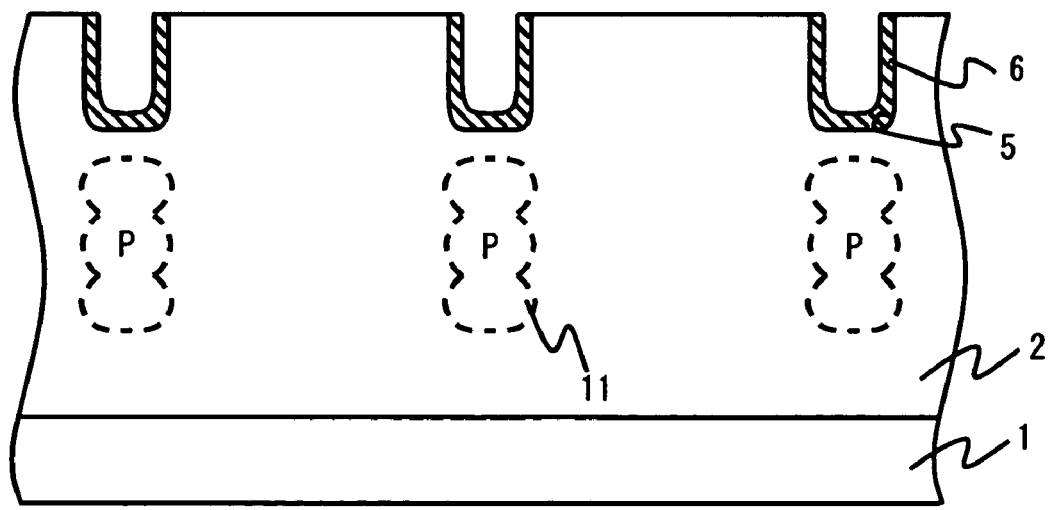
FIG. 2 is a cross-sectional view showing a manufacturing process of a vertical power MOSFET of the first embodiment.

After that, the process performs implantation of boron (B) ion to form the P column region 11 beneath the gate trench 5. The boron ion is implanted into a deep part of the P column region 11 with about 500 keV and into a shallow part of the P column region 11 with about 100 keV. FIG. 2 is a cross-sectional view of the semiconductor device produced by the process up to this step.

After that, the process deposits polysilicon in the gate trench 5 by CVD to form the trench gate 7. It then etches back the polysilicon so as to remain only inside the gate trench 5. Then, it performs implantation of boron or boron fluoride ($BF_2$) ion and thermal treatment in the oxygen or nitrogen atmosphere, thereby forming the P base layer 3 which is thinner than the gate trench 5. Further, it performs implantation of As ion and thermal treatment in the nitrogen atmosphere on the surface of the P base layer 3, thereby forming the $N^+$ source layer 4. Then, it deposits the interlayer oxide film 8 with a thickness of 0.5 to 1 μm by CVD. After that, the process performs patterning by photolithography, etches the interlayer oxide film 8, and successively performs silicon etching on the part where the P base layer 3 is exposed by the depth of 0.5 μm, thereby creating the column trench 9.

Figure 3:
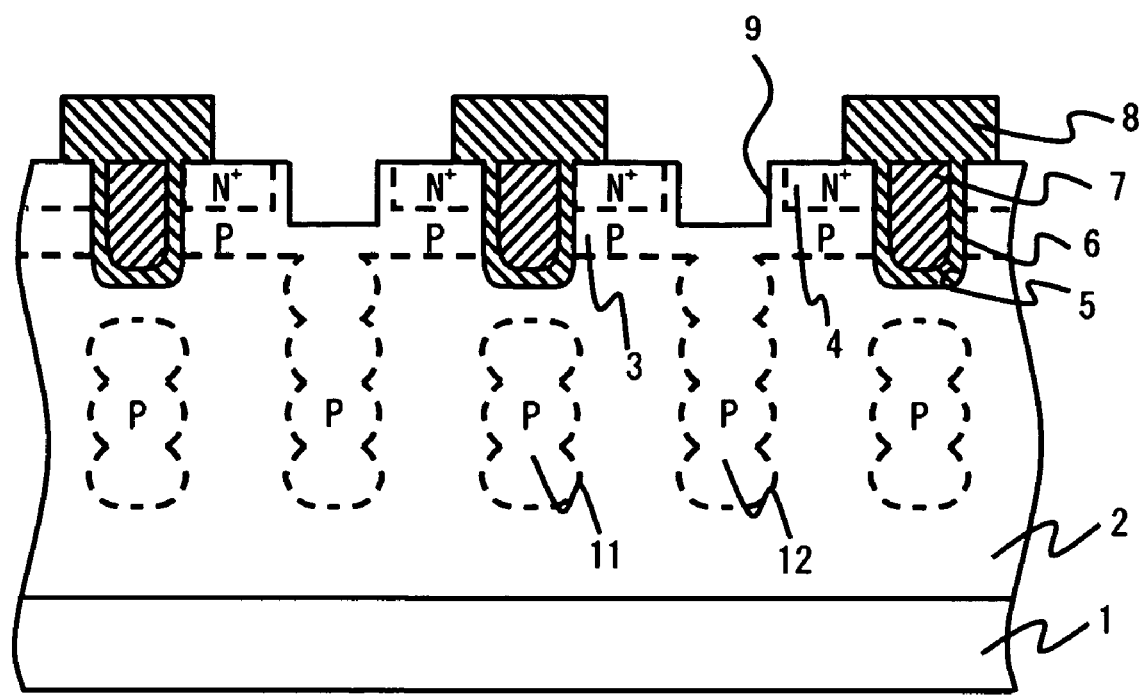
FIG. 3 is a cross-sectional view showing a manufacturing process of a vertical power MOSFET of the first embodiment.

Then, the process performs implantation of boron (B) ion to form the P column region 12 beneath the column trench. The boron ion is implanted into a deep part of the P column region 12 with about 1.5 MeV and into a shallow part of the P column region 12 with about 500 keV. FIG. 3 is a cross-sectional view of the semiconductor device produced by the process up to this step. In the implantation of boron ion, the boron ion concentration is controlled so that a sum of depletion charge in the P column regions 11 and 12 is substantially equal to depletion charge in the N epitaxial layer 2.

The process further performs patterning by photolithography and etches the interlayer oxide film 8 so as to expose the $N^+$ source layer 4, thereby forming the contact region.

After that, the process deposits aluminum (Al), aluminum silicon (AlSi), or aluminum copper silicon (AlSiCu) by sputtering to form the source electrode 10. Then, it deposits glazing material such as an oxide film and a nitride film as a surface overcoat and performs patterning by photolithography and etching to form a bonding region or the like. Finally, the process grinds the rear surface of the $N^+$ silicon substrate 1 by a given thickness and evaporates several kinds of metal, thereby forming the drain electrode 13.

The operation of the vertical power MOSFET according to the first embodiment is described below. In this vertical power MOSFET, if a voltage higher than a threshold voltage Vt is applied to a gate electrode (not shown) which is connected to the trench gate 7, the P base 3 in contact with the side wall of the gate trench 5 is inverted to become a channel where drain current flows. Specifically, a current path in the ON-state involves the source electrode 10, the $N^+$ source layer 4, the channel region, the N epitaxial layer 2, the $N^+$ silicon substrate 1, and the drain electrode 13. In the OFF-state when no voltage is applied to the gate electrode, it is possible to apply a high voltage between source and drain, and a depletion layer is created mainly in the PN junction of the N epitaxial layer 2 with the P base layer 3 and the P column regions 11 and 12. The depletion layer spreads as the source-drain voltage becomes higher, and it eventually extends with a uniform thickness in the N epitaxial layer 2. Further, if a higher voltage is applied between source and drain to exceed a breakdown voltage, breakdown occurs and avalanche current flows between the source and drain.

The vertical power MOSFET of this embodiment has the P column regions 11 beneath the gate trenches 5 in addition to the P column region 12 between the adjacent gate trenches 5. It is thereby possible to increase the ratio of P-type semiconductor with respect to N-type semiconductor of the N epitaxial layer 2 even if a distance between the adjacent gate trenches 5 is large. Further, the impurity concentration of the P column regions 11 and 12 is set so that their depletion charge is equal to depletion charge in the N epitaxial layer 2. Therefore, the depletion layer is formed with a uniform thickness when a high voltage is applied between source and drain. It is thereby possible to obtain high breakdown voltage in a vertical power MOSFET with a large cell in which a distance between the trench gates is large.

In the vertical power MOSFET of this embodiment, the P column regions 11 and 12 are divided so as to exist beneath the gate trench 5 and between the adjacent gate trenches 5. The P column regions 11 and 12 are thus not formed in a drain current path. No resistance therefore exists in the current path, and therefore an increase in on-resistance does not occur.

According to the vertical power MOSFET of this embodiment, it is possible to achieve a high breakdown voltage vertical power MOSFET with small gate capacitance and low on-resistance.

Since the P column regions 11 and 12 are respectively formed in separate steps, it is possible to individually set the depth and impurity concentration of the P column regions. This allows for high design freedom of the P column regions.

For example, if it is designed so that breakdown occurs in the P column region 12 beneath the column trench 9 prior to in the P column region 11 beneath the gate trench 5 by increasing the depth or concentration of the P column region 12, no avalanche current flows near the gate trench 5 and thereby breakdown resistance increases.

Figure 4A:
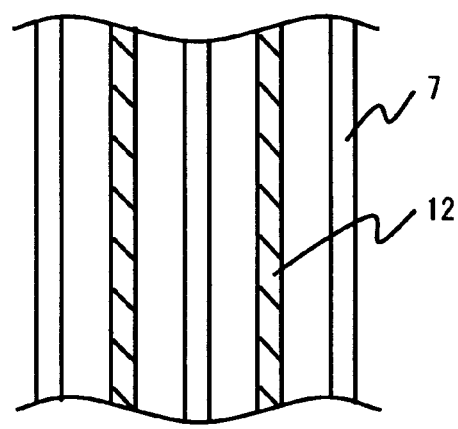
FIGS. 4A to 4C are views showing a flat layout of a trench gate and a P column region of a vertical power MOSFET of the first embodiment.
Figure 4B:
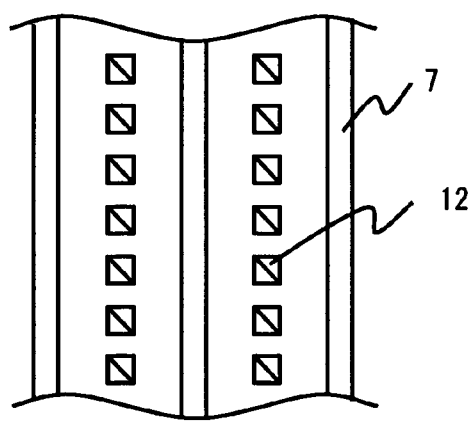
Figure 4C:
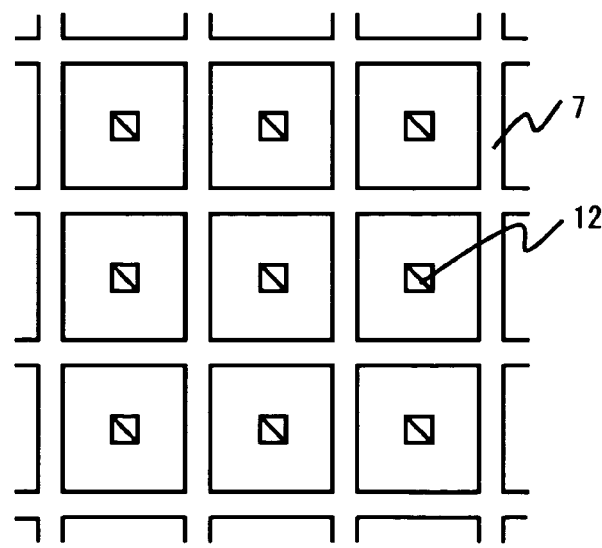

FIGS. 4A to 4C are top down views illustrating examples of the trench gate 7 and the P column region 12 of the vertical power MOSFET of the first embodiment. Though not shown in FIGS. 4A to 4C, the P column region 11 is formed below the trench gate 7. In FIG. 4A, the trench gate 7 is stripe-shaped, and the P column region 12 is also stripe-shaped and placed between the trench gates 7. In FIG. 4B, the trench gate 7 is stripe-shaped, and the P column region 12 is island-shaped and arranged parallel to the trench gate 7. In FIG. 4C, the trench gate 7 is lattice-shaped, and the P column region 12 is island-shaped and placed at the substantially center of each rectangular defined by the lattice.

Second Embodiment

Figure 5:
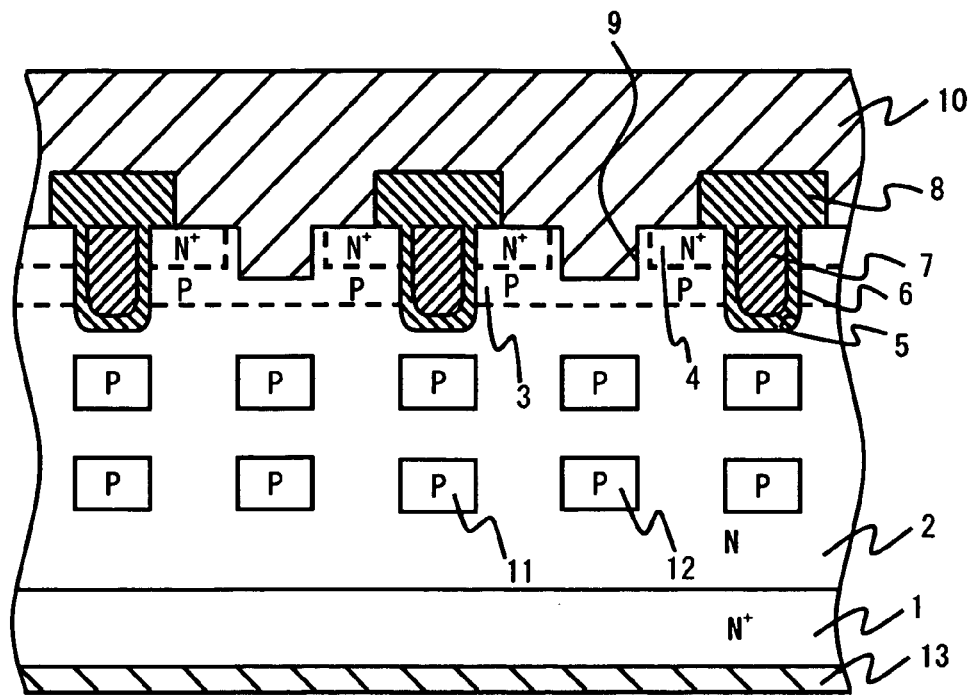
FIG. 5 is a cross-sectional view of a power MOSFET of a second embodiment.
Figure 6:
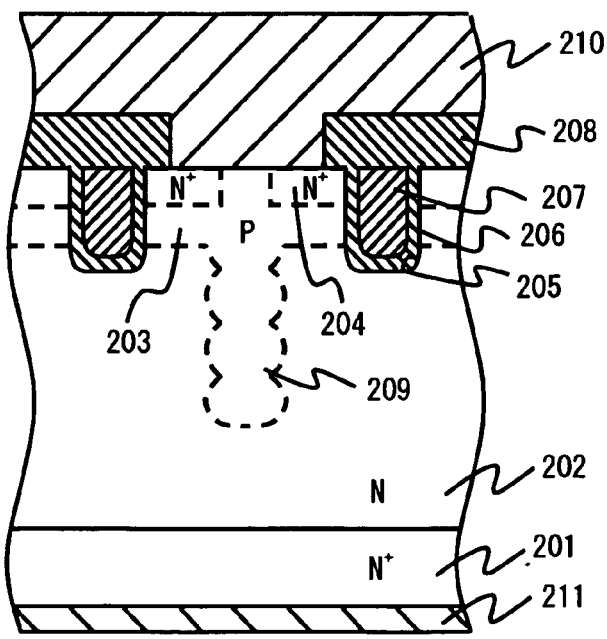
FIG. 6 is a cross-sectional view of a vertical power MOSFET of related art.

FIG. 5 is a cross-sectional view of a vertical power MOSFET according to a second embodiment of the invention. The vertical power MOSFET shown in FIG. 5 has the P column regions 11 and 12 each formed in a separate shape, while the vertical power MOSFET of the first embodiment has the P column regions 11 and 12 each formed in a continuous shape. In the second embodiment, the P column regions 11 and 12 are each vertically separated into two parts. If the surface of the N⁺ source layer 4 is a reference (0 μm), the depth of the bottom surface of the P base layer is about 1 μm, the depth of the column region formed in a shallow layer is about 2 μm, and the depth of the column region formed in a deep layer is about 3 μm. The other shape is substantially the same in the vertical power MOSFETs of the first and the second embodiments.

Since the basic structure of the vertical power MOSFET of the second embodiment is the same as that of the first embodiment, the structure, manufacturing process, and operation are not described here.

In the vertical power MOSFET of the second embodiment as well, if a high voltage is applied between source and drain, a depletion layer spreads from the P base layer 3 and the P column regions 11 and 12 and eventually extends with a uniform thickness in the N epitaxial layer 2. It is thereby possible to obtain high breakdown voltage just like in the first embodiment.

The P column region 11 is formed beneath the trench gate 7, and the P column region 12 is formed beneath the column trench 9 between the trench gates. Thus, the P column regions 11 and 12 are placed beneath the trench gate 7 and the column trench 9 just like in the first embodiment. Thus, an increase in the on-resistance of the vertical power MOSFET does not occur in this embodiment also. Further, since the P column regions 11 and 12 are formed in separate steps, the second embodiment also allows for high design freedom.

The present invention is not limited to the above embodiments but may be altered in various ways. For example, the P column region may be separated into three or more parts. Further, the P column region beneath the trench gate may be in contact with the gate trench, which produces the same effect. The flat layout is also not limited to the above embodiments but may be altered according to the layout of the trench gate.

It is apparent that the present invention is not limited to the above embodiment that may be modified and changed without departing from the scope and spirit of the invention.

What is claimed is:

1. A vertical MOSFET having a plurality of first trenches in each of which a trench gate is formed, comprising:
   first column regions of a second conductivity type placed beneath the first trenches respectively, said first column regions being oriented vertically in a layer of a first conductivity type; and
   a second column region of the second conductivity type placed beneath a base region, said base region being between the first trenches and above said layer of said first conductivity type, and said second column region being oriented vertically in the layer of the first conductivity type,
   wherein a total depletion charge in the first and the second column regions is substantially equal to a depletion charge in the layer of the first conductivity type.

2. The vertical MOSFET of claim 1, wherein the first column region is separate from the first trench.

3. The vertical MOSFET of claim 2, wherein the first column region is in continuous form.

4. The vertical MOSFET of claim 2, wherein the first column region comprises a plurality of separate regions.

5. The vertical MOSFET of claim 1, wherein the second column region is continuous with the base region.

6. The vertical MOSFET of claim 5, wherein the second column region is in a continuous form.

7. The vertical MOSFET of claim 1, wherein the second column region is separate from the base region.

8. The vertical MOSFET of claim 7, wherein the second column region is in continuous form.

9. The vertical MOSFET claim 7, wherein the second column region comprises a plurality of separate regions.

10. The vertical MOSFET of claim 1, wherein each of the first and the second column regions is in a continuous form.

11. The vertical MOSFET of claim 1, wherein each of the first and the second column regions comprises a plurality of separate regions.

12. The vertical MOSFET of claim 1, wherein the second column region is located beneath a second trench located in a surface of the base region.

13. The vertical MOSFET of claim 12, wherein the second trench is located between said first trenches with trench gates, the base layer is exposed at the location of the second trench, and a source electrode is located thereon.

14. The vertical MOSFET of claim 13, wherein the second column region is continuous with the base region.

15. The vertical MOSFET of claim 14, wherein the second column region is in a continuous form.

16. The vertical MOSFET of claim 13, wherein the second column region is separate from the base region.

17. The vertical MOSFET of claim 16, wherein the second column region is in continuous form.

18. The vertical MOSFET of claim 16, wherein the second column region comprises a plurality of separate regions.

* * * * *